(12) United States Patent
Yonekura et al.

(10) Patent No.: US 8,641,825 B2
(45) Date of Patent: Feb. 4, 2014

(54) SUBSTRATE TEMPERATURE REGULATION FIXED APPARATUS

(75) Inventors: Hiroshi Yonekura, Nagano (JP); Miki Saito, Nagano (JP); Koki Tamagawa, Nagano (JP)

(73) Assignee: Shinko Electric Industries Co., Ltd., Nagano-shi, Nagano (JP)

(*) Notice: Subject to any disclaimer, the term of this patent is extended or adjusted under 35 U.S.C. 154(b) by 1148 days.

(21) Appl. No.: 12/482,482

(22) Filed: Jun. 11, 2009

(65) Prior Publication Data

US 2009/0308538 A1    Dec. 17, 2009

(30) Foreign Application Priority Data

Jun. 13, 2008  (JP) .................... 2008-156018

(51) Int. Cl.
C23C 16/50 (2006.01)
C23C 16/00 (2006.01)
C23F 1/00 (2006.01)
H01L 21/306 (2006.01)

(52) U.S. Cl.
USPC .......... 118/728; 118/729; 118/730; 118/731; 118/732; 118/733; 156/345.51; 156/345.52; 156/345.53; 156/345.54; 156/345.55

(58) Field of Classification Search
USPC ............. 118/728–732; 156/345.51–345.55
See application file for complete search history.

(56) References Cited

U.S. PATENT DOCUMENTS

| | | | | |
|---|---|---|---|---|
| 2,567,162 | A * | 9/1951 | Sanders | 428/384 |
| 3,431,160 | A * | 3/1969 | Kurokochi et al. | 156/228 |
| 5,766,750 | A * | 6/1998 | Korleski | 428/308.4 |
| 6,280,584 | B1 * | 8/2001 | Kumar et al. | 204/298.15 |
| 2003/0161088 | A1 * | 8/2003 | Migita | 361/234 |
| 2005/0098120 | A1 * | 5/2005 | Maki | 118/728 |
| 2007/0144442 | A1 * | 6/2007 | Migita | 118/728 |
| 2008/0017104 | A1 | 1/2008 | Matyushkin et al. | |

FOREIGN PATENT DOCUMENTS

| | | |
|---|---|---|
| JP | 07-153820 | 6/1995 |
| JP | 2000-317761 | 11/2000 |
| JP | 2000-332091 | 11/2000 |
| JP | 2003-224180 | 8/2003 |
| JP | 2005-033181 | 2/2005 |
| JP | 2008/28354 | 2/2008 |
| JP | 2008-034465 | 2/2008 |

* cited by examiner

Primary Examiner — Maureen Gramaglia
Assistant Examiner — Tiffany Nuckols
(74) Attorney, Agent, or Firm — Drinker Biddle & Reath LLP

(57) ABSTRACT

A substrate temperature regulation fixed apparatus has a base substance on which a vacuumed object is placed, an adhesive layer and a base plate. The base substance is fixed on the base plate through the adhesive layer. The adhesive layer contains a substance having plasma resistance.

3 Claims, 13 Drawing Sheets

SUBSTRATE TEMPERATURE REGULATION FIXED APPARATUS

This application claims priority to Japanese Patent Application No. 2008-156018, filed Jun. 13, 2008, in the Japanese Patent Office. The Japanese Patent Application No. 2008-156018 is incorporated by reference in its entirety.

TECHNICAL FIELD

The present disclosure relates to a substrate temperature regulation fixed apparatus, and particularly to a substrate temperature regulation fixed apparatus having an electrostatic chuck for vacuuming a vacuumed object placed on a base substance.

RELATED ART

In the related art, a plasma etching apparatus or a film formation apparatus (for example, a CVD apparatus or a PVD apparatus) used in the case of manufacturing a semiconductor apparatus such as an IC or an LSI has a stage for holding a substrate (for example, a silicon wafer) inside a vacuum processing chamber with high accuracy. As such a stage, for example, a substrate temperature regulation fixed apparatus having an electrostatic chuck is proposed. The substrate temperature regulation fixed apparatus is an apparatus for vacuuming and holding a substrate by the electrostatic chuck and performing temperature control so that the substrate vacuumed and held reaches a predetermined temperature.

FIG. 1 is a plan view simplifying and illustrating a related-art substrate temperature regulation fixed apparatus. FIG. 2 is a sectional view along line A-A of FIG. 1 simplifying and illustrating the related-art substrate temperature regulation fixed apparatus. Referring to FIGS. 1 and 2, a substrate temperature regulation fixed apparatus 100 has an electrostatic chuck 101, an adhesive layer 105 and a base plate 106. The electrostatic chuck 101 is a coulombic type electrostatic chuck having a base substance 102 and an electrostatic electrode 103. The base substance 102 is fixed on the base plate 106 through the adhesive layer 105. The base substance 102 is constructed by ceramics. The base plate 106 is constructed by metal such as Al.

Since the base substance 102 constructed by ceramics differs from the base plate 106 constructed by metal such as Al in a thermal expansion coefficient, the adhesive layer 105 for gluing the base substance 102 to the base plate 106 requires flexibility in order to ease stress caused by a difference between these thermal expansion coefficients. Because of that, a silicon adhesive having flexibility is used as the adhesive layer 105.

An outer peripheral seal ring 102b which is an annular projection part in plan view is disposed in an outer edge of an upper surface 102a of the base substance 102. Multiple columnar projection parts 102c are disposed inside the outer peripheral seal ring 102b in plan view so as to be scattered in a polka-dot shape in plan view.

The electrostatic electrode 103 is a thin-film electrostatic electrode and is built into the base substance 102. The electrostatic electrode 103 is connected to a DC power source (not shown) disposed outside the substrate temperature regulation fixed apparatus 100 and when a predetermined voltage is applied, a vacuumed object (not shown) such as a substrate is vacuumed and held on upper surfaces of the multiple projection parts 102c and the outer peripheral seal ring 102b. Vacuuming and holding force becomes strong as the voltage applied to the electrostatic electrode 103 is high.

The base plate 106 is means for supporting the electrostatic chuck 101. A heating element (not shown) or a water passage 104 is disposed in the base plate 106, and temperature control of the base substance 102 is performed. The heating element (not shown) generates heat by applying a voltage, and heats the base substance 102 through the adhesive layer 105.

The water passage 104 has a cooling water inlet part 104a and a cooling water outlet part 104b formed in a lower surface 106b of the base plate 106. The cooling water inlet part 104a and the cooling water outlet part 104b are connected to a cooling water controller (not shown) disposed outside the substrate temperature regulation fixed apparatus 100. The cooling water controller (not shown) introduces cooling water from the cooling water inlet part 104a to the water passage 104 and discharges the cooling water from the cooling water outlet part 104b. The base substance 102 is cooled through the adhesive layer 105 by circulating the cooling water and cooling the base plate 106.

A gas passage 108 extending through the base substance 102, the adhesive layer 105 and the base plate 106 is formed in the base substance 102, the adhesive layer 105 and the base plate 106. The gas passage 108 has plural gas inlet parts 108a formed in the lower surface 106b of the base plate 106 and plural gas outlet parts 108b formed in the upper surface 102a of the base substance 102. The plural gas inlet parts 108a are connected to a gas pressure controller (not shown) disposed outside the substrate temperature regulation fixed apparatus 100. The gas pressure controller (not shown) can vary a pressure of an inert gas in the range of, for example, 0 to 50 Torr and introduce the inert gas from the gas inlet parts 108a to the gas passage 108.

FIG. 3 is a sectional view simplifying and illustrating a state in which the related-art substrate temperature regulation fixed apparatus vacuums and holds a substrate. In FIG. 3, the same numerals are assigned to the same components as those of FIGS. 1 and 2 and its description may be omitted. In FIG. 3, numeral 107 is a substrate and numeral 109 is a gas filling part filled with an inert gas. Referring to FIG. 3, the substrate 107 is vacuumed and held on upper surfaces of the multiple projection parts 102c and the outer peripheral seal ring 102b of the base substance 102. Temperature control of the substrate 107 is performed by the water passage 104 or the heating element (not shown) built into the base plate 106.

The gas pressure controller (not shown) introduces an inert gas from the plural gas inlet parts 108a to the gas passage 108. When the introduced inert gas is discharged from the gas outlet parts 108b and the gas filling part 109 which is space formed between the substrate 107 and the upper surface 102a of the base substance 102 is filled with the inert gas, thermal conductivity between the base substance 102 and the substrate 107 improves. The outer peripheral seal ring 102b is disposed in order to prevent the inert gas with which the gas filling part 109 is filled from leaking to the outside of the gas filling part 109.

As described above, the related-art substrate temperature regulation fixed apparatus 100 vacuums and holds the substrate 107 on the upper surfaces of the multiple projection parts 102c and the outer peripheral seal ring 102b of the base substance 102 of the electrostatic chuck 101. Also, the outer peripheral seal ring 102b which is the annular projection part in plan view disposed in the outer edge of the upper surface 102a of the base substance 102 of the related-art substrate temperature regulation fixed apparatus 100 prevents an inert gas with which the gas filling part 109 is filled from leaking to the outside of the gas filling part 109 in order to improve thermal conductivity between the base substance 102 and the substrate 107. Also, the water passage 104 or the heating element (not shown) built into the base plate 106 of the related-art substrate temperature regulation fixed apparatus 100 controls a temperature of the substrate 107 (for example, see Patent References 1 to 3).

[Patent Reference 1] JP-A-2000-317761
[Patent Reference 2] JP-A-2000-332091
[Patent Reference 3] JP-A-2003-224180

However, when the related-art substrate temperature regulation fixed apparatus 100 is used in plasma, a silicon adhesive constructing the adhesive layer 105 has low plasma resistance, so that an outer edge of the adhesive layer 105 is eroded by being exposed to plasma. Also, in order to remove an accretion deposited on the upper surface 102a of the base substance 102, plasma cleaning is done, but in the case of the cleaning, plasma intrudes into a through hole of the gas passage 108 etc. disposed in the adhesive layer 105 and a peripheral part of the through hole of the adhesive layer 105 is eroded by being exposed to the plasma.

When the adhesive layer 105 is eroded, there were a problem of reducing thermal conductivity between the base substance 102 and the substrate 107 by leakage of an inert gas from the eroded portion, a problem of reducing the degree of vacuum of the inside of a vacuum chamber using the substrate temperature regulation fixed apparatus 100 or a problem of contaminating the substrate 107 with particles by occurrence of the particles.

SUMMARY

Exemplary embodiments of the present invention provide a substrate temperature regulation fixed apparatus having an adhesive layer with good plasma resistance.

Exemplary embodiments of the present invention is a substrate temperature regulation fixed apparatus having a base substance on which a vacuumed object is placed, an adhesive layer and a base plate. The base substance is fixed on the base plate through the adhesive layer. The adhesive layer contains a substance having plasma resistance.

According to the invention, a substrate temperature regulation fixed apparatus having an adhesive layer with good plasma resistance can be provided.

Other features and advantages may be apparent from the following detailed description, the accompanying drawings and the claims.

DETAILED DESCRIPTION

The best mode for carrying out the invention will hereinafter be described with reference to the drawings.

First Embodiment

Figure 1:
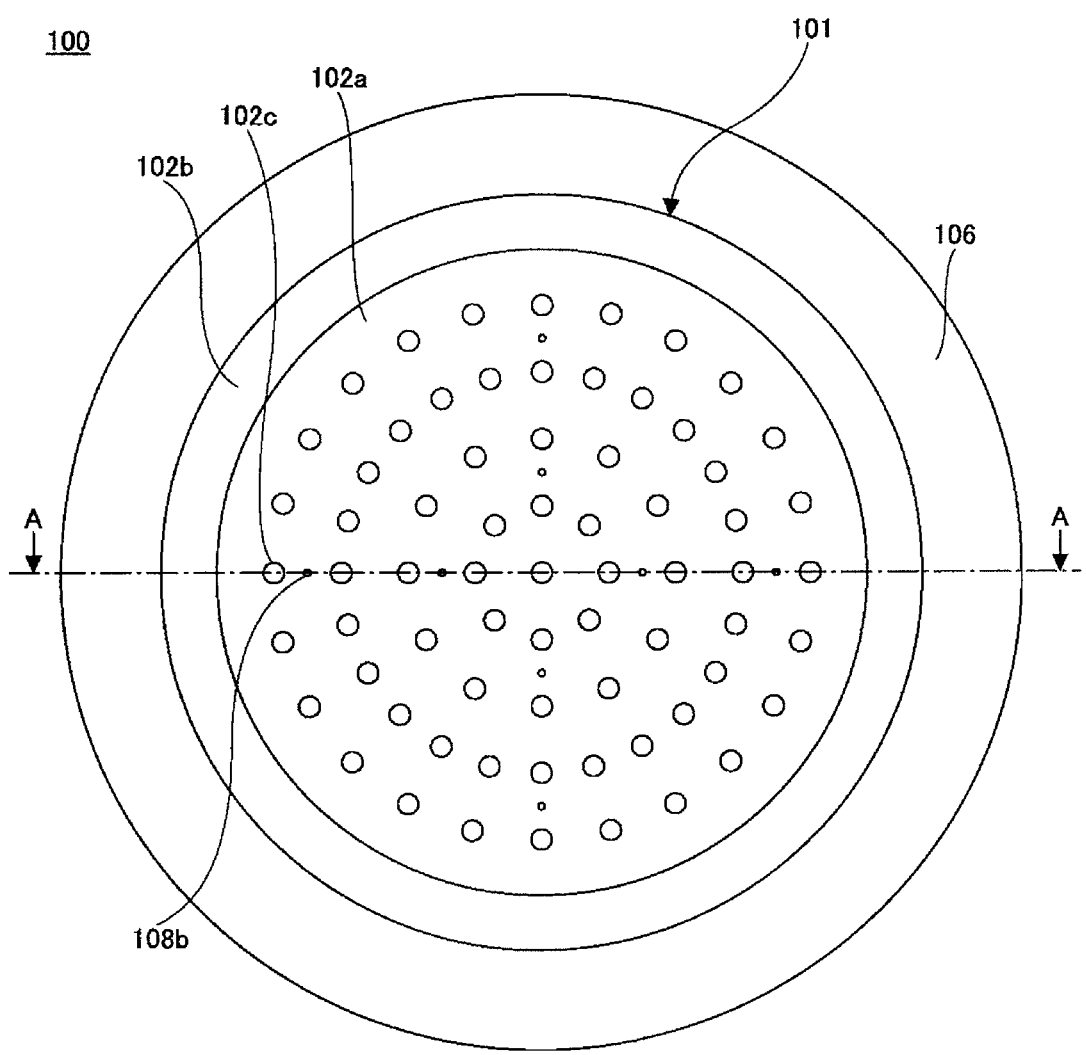
FIG. 1 is a plan view simplifying and illustrating a related-art substrate temperature regulation fixed apparatus.
Figure 2:
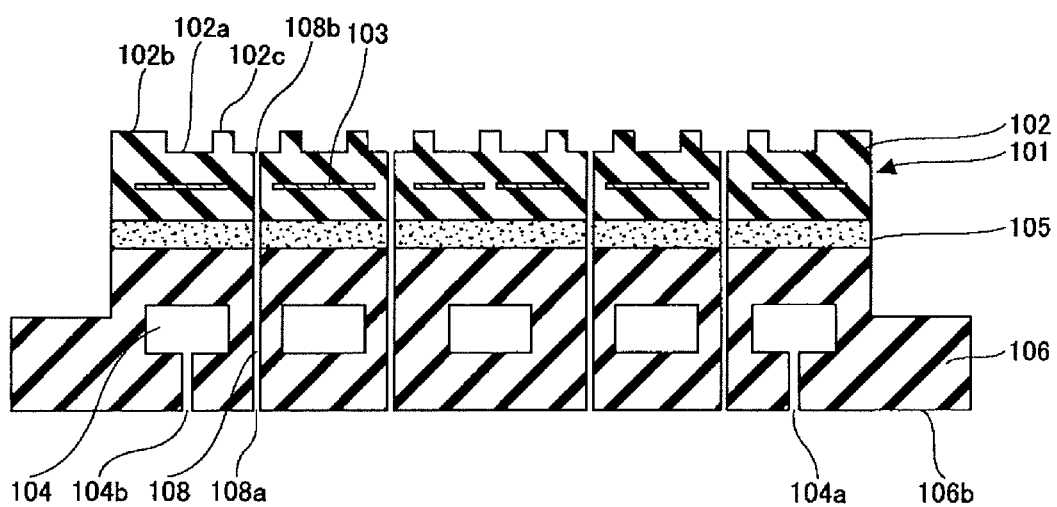
FIG. 2 is a sectional view along line A-A of FIG. 1 simplifying and illustrating the related-art substrate temperature regulation fixed apparatus.
Figure 3:
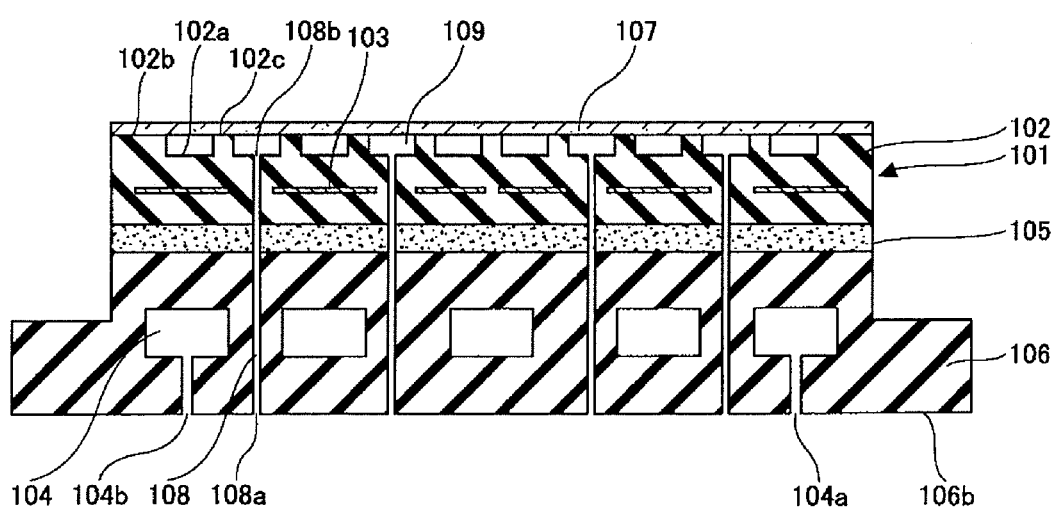
FIG. 3 is a sectional view simplifying and illustrating a state in which the related-art substrate temperature regulation fixed apparatus vacuums and holds a substrate.
Figure 4:
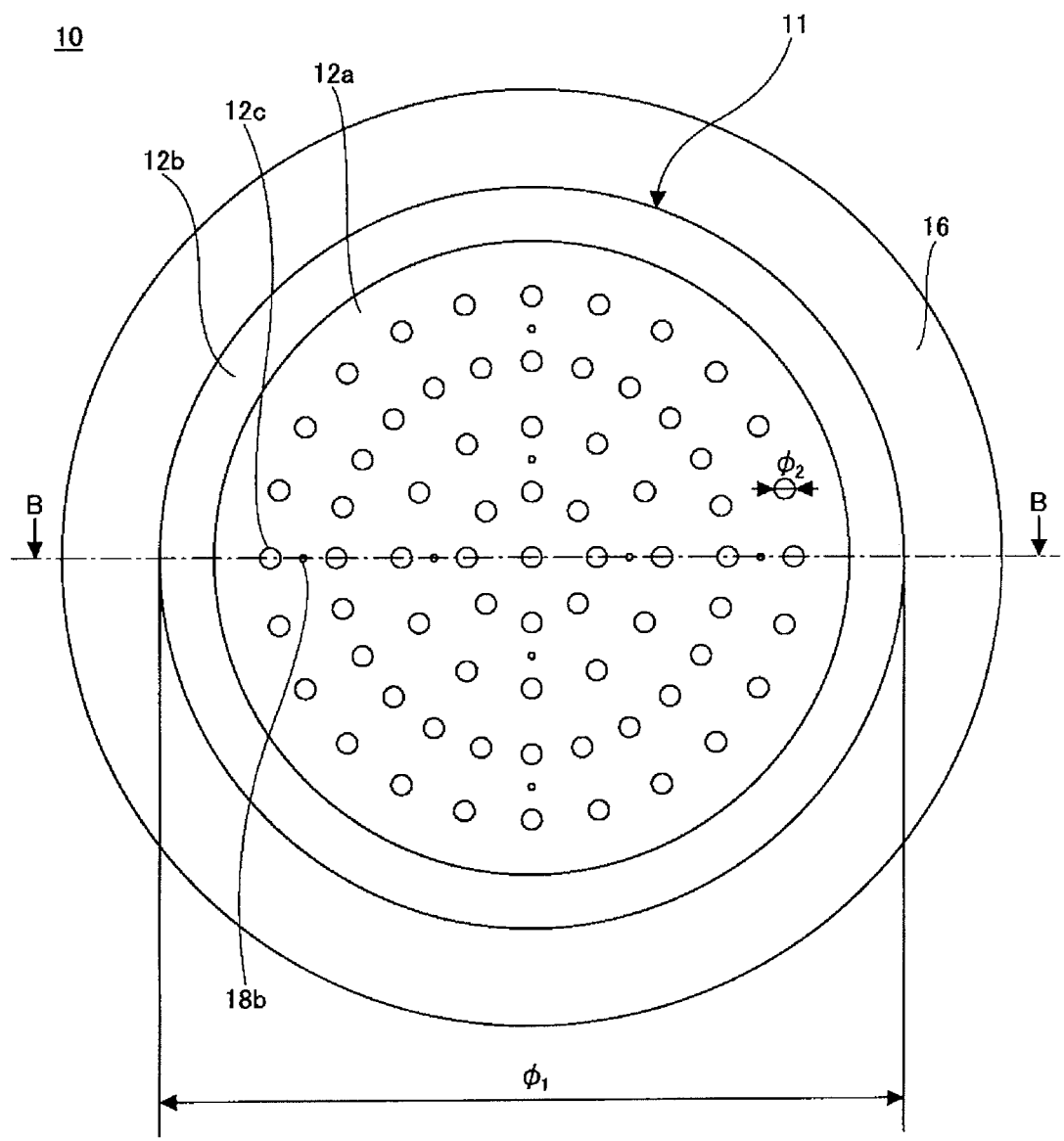
FIG. 4 is a plan view simplifying and illustrating a substrate temperature regulation fixed apparatus according to a first embodiment of the invention.
Figure 5:
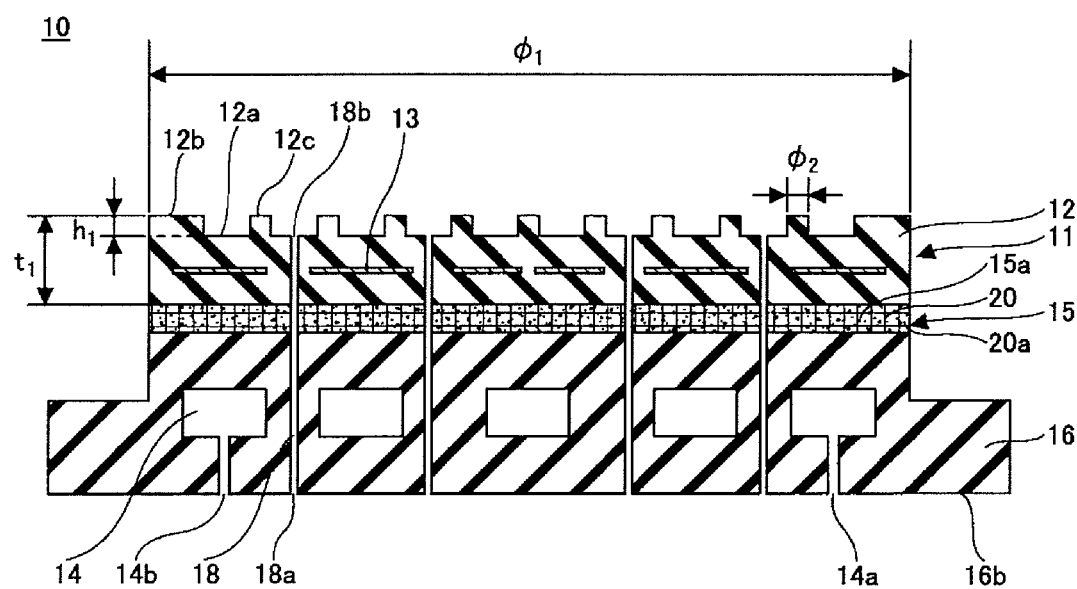
FIG. 5 is a sectional view along line B-B of FIG. 4 simplifying and illustrating the substrate temperature regulation fixed apparatus according to the first embodiment of the invention.

FIG. 4 is a plan view simplifying and illustrating a substrate temperature regulation fixed apparatus according to a first embodiment of the invention. FIG. 5 is a sectional view along line B-B of FIG. 4 simplifying and illustrating the substrate temperature regulation fixed apparatus according to the first embodiment of the invention. Referring to FIGS. 4 and 5, a substrate temperature regulation fixed apparatus 10 has an electrostatic chuck 11, an adhesive layer 15 and a base plate 16.

The electrostatic chuck 11 is a coulombic type electrostatic chuck having a base substance 12 and an electrostatic electrode 13. The base substance 12 is a dielectric and is fixed on the base plate 16 through the adhesive layer 15. As the base substance 12, for example, ceramics such as AlN or $Al_2O_3$ can be used.

A thickness $t_1$ of the base substance 12 can be set at, for example, 1 to 20 mm. An outside diameter $\phi_1$ of the base substance 12 can be set at, for example, 6 inches, 8 inches or 12 inches. A dielectric constant (1 KHz) of the base substance 12 can be set at, for example, 9 to 10, and volume resistivity of the base substance 12 can be set at, for example, $10^{12}$ to $10^{16}$ Ωm.

An outer peripheral seal ring 12b which is an annular projection part in plan view is disposed in an outer edge of an upper surface 12a of the base substance 12. Multiple columnar projection parts 12c are disposed inside the outer peripheral seal ring 12b in plan view so as to be scattered in a polka-dot shape in plan view. An upper surface of the outer peripheral seal ring 12b is substantially flush with upper surfaces of the projection parts 12c. By disposing the multiple projection parts 12c on the upper surface 12a of the base substance 12 thus, particles adhering to the back surface side of a vacuumed object can be reduced.

Heights $h_1$ of upper surfaces of the multiple projection parts 12c are substantially the same and the height $h_1$ can be set at, for example, 5 to 30 μm. A diameter $\phi_2$ of the upper surface of the projection part 12c can be set at, for example, 0.1 to 2.0 mm. The projection part 12c may have an ellipse in plan view, a polygon in plan view such as a hexagon in plan view, shapes in which plural columns with different diameters are combined, these combinations, etc. in addition to the columnar shape (circular shape in plan view). In addition, including the cases in addition to the case where the projection part 12c has the columnar shape (circular shape in plan view), it is represented as the "polka-dot shape in plan view" in the present application.

The projection parts 12c are formed by, for example, sandblasting. Concretely, the projection parts 12c are formed by masking the portion which wants to form the projection parts 12c of the upper surface 12a of the base substance 12 and blasting the upper surface 12a of the base substance 12 with fine particles by a pressure of gas and grinding the unmasked portion. In addition, the projection parts 12c may be arranged according to any regularity as long as the projection parts 12c are disposed on the upper surface 12a of the base substance 12 substantially uniformly.

The electrostatic electrode 13 is a thin-film electrode and is built into the base substance 12. The electrostatic electrode 13 is connected to a DC power source (not shown) disposed outside the substrate temperature regulation fixed apparatus 10 and when a predetermined voltage is applied, Coulomb's force is generated between the electrostatic electrode 13 and a vacuumed object (not shown) such as a substrate, and the vacuumed object (not shown) is vacuumed and held on upper surfaces of the multiple projection parts 12c and the outer peripheral seal ring 12b. Vacuuming and holding force becomes strong as the voltage applied to the electrostatic electrode 103 is high. The electrostatic electrode 13 may have a unipolar shape or a bipolar shape. As a material of the electrostatic electrode 13, for example, tungsten or molybdenum can be used.

The adhesive layer 15 is disposed in order to fix the base substance 12 on the base plate 16. A thickness of the adhesive layer 15 may be arbitrary and can be set at, for example, 0.1 to 0.5 mm. The adhesive layer 15 includes a member 20 in an adhesive 15a. The member 20 includes a substance having plasma resistance as a main component.

The reason why the adhesive layer 15 includes the member 20 is because an outer edge of the adhesive layer 15 is prevented from being eroded by being exposed to plasma when the substrate temperature regulation fixed apparatus 10 is used in the plasma. Also, the reason is because a situation in which plasma intrudes from a through hole of a gas passage 18 etc. disposed in the adhesive layer 15 and a peripheral part of the through hole of the adhesive layer 15 is eroded by being exposed to the plasma in the case of plasma cleaning is prevented.

Figure 6:
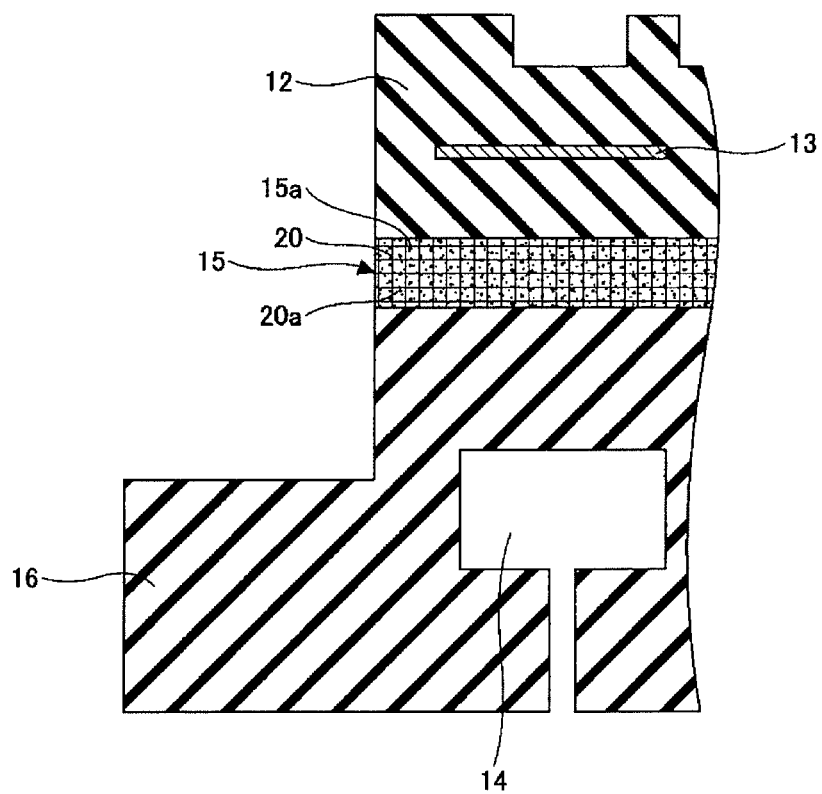
FIG. 6 is a sectional view enlarging and illustrating an adhesive layer in FIG. 5.
Figure 7:
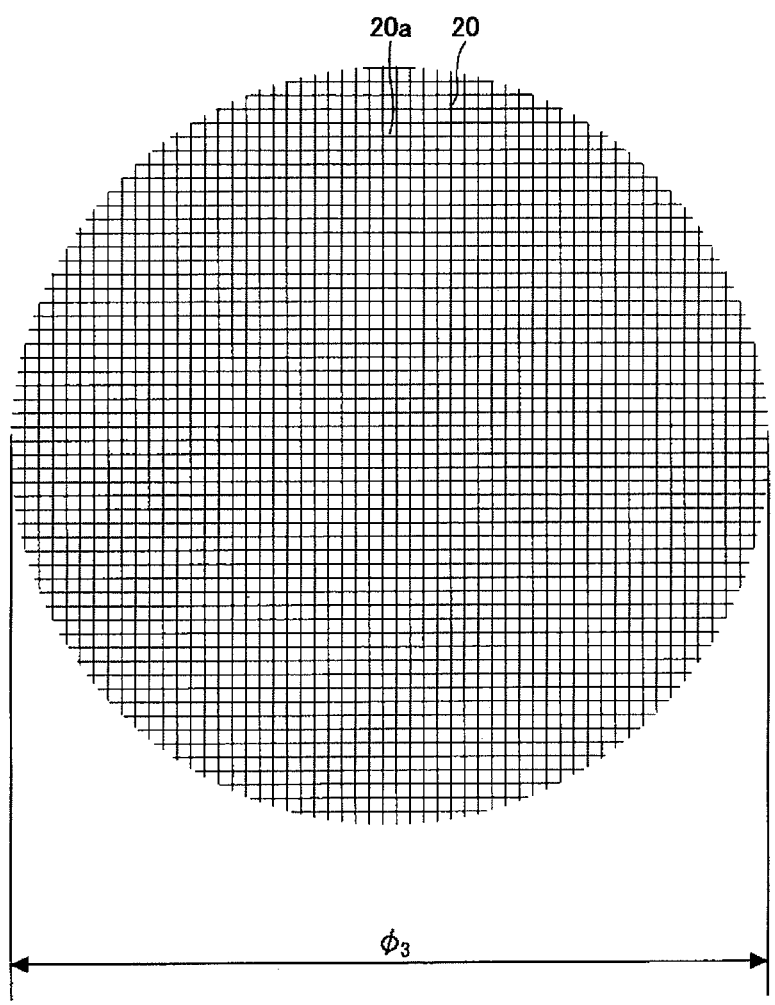
FIG. 7 is a plan view showing an example of a member included in an adhesive layer.

FIG. 6 is a sectional view enlarging and illustrating the adhesive layer in FIG. 5. FIG. 7 is a plan view showing an example of a member included in the adhesive layer. In FIGS. 6 and 7, the same numerals are assigned to the same components as those of FIG. 5 and its description may be omitted. The member 20 shown in FIGS. 6 and 7 is a member with substantially a circle in plan view and is disposed in substantially the whole adhesive layer 15. An outside diameter $\phi_3$ of the member 20 is somewhat smaller than or substantially equal to the outside diameter $\phi_1$ of the base substance 12. A thickness of the member 20 can properly be determined according to the thickness of the adhesive layer 15. The member 20 includes a substance having plasma resistance as a main component.

In the member 20, plural opening parts 20a are disposed in a net shape (mesh shape). The opening parts 20a of the member 20 are filled with the adhesive 15a. Arrangement of the plural opening parts 20a in the member 20 may be regular or irregular. A size of the plural opening parts 20a is not particularly limited and can be set at, for example, about 10 to 200 mesh of mesh standards. It is unnecessary that the sizes of all the opening parts 20a should be the same.

As the adhesive 15a, for example, a silicon adhesive with excellent flexibility and good thermal conductivity can be used. The member 20 can be constructed of a material including a fluorine resin such as polytetrafluoroethylene as a main component. This is because the fluorine resin such as polytetrafluoroethylene has excellent plasma resistance. In addition, a member, which has plural net-shaped opening parts and includes polytetrafluoroethylene as a main component, may be called a Teflon (registered trademark) mesh.

A polyimide resin can also be used as the member 20. This is because the polyimide resin also has excellent plasma resistance. However, the polyimide resin has problems that, for example, hardness is high and workability is not good and also a relatively thin type is large and it is difficult to obtain a fine polyimide resin with 100 mesh, 200 mesh, etc. On the other hand, in the fluorine resin such as polytetrafluoroethylene, thin to thick fluorine resins are easily obtainable and there is also a soft resin, so that it is also easy to perform hole processing etc. Also, the Teflon mesh with about 10 to 200 mesh is easily obtainable. It is preferable to use the fluorine resin such as polytetrafluoroethylene as the member 20 in consideration of workability, availability, etc. thus.

The reason why the member 20 has the plural opening parts 20a is because properties of adhesion between the base substance 12 and the base plate 16 are improved. For example, a member, which does not have opening parts and includes a substance having plasma resistance as a main component, can also be included in the adhesive layer 15. Also in this case, an effect of the invention described below is achieved, but the properties of adhesion between the base substance 12 and the base plate 16 reduce, so that it is preferable to have the opening parts in order to maintain the adhesion properties.

Thus, the opening parts 20a in the member 20 are disposed in order to improve the properties of adhesion between the base substance 12 and the base plate 16, so that it is unnecessary that the opening parts 20a should have the net shape. As examples of other forms of the opening parts, plural holes, plural slits, etc. can be given. A size of the opening parts is not particularly limited, and preferably is about 1 to 10 mm in width for the slits and is about 1 to 10 mm in diameter for the holes.

In order to form the adhesive layer 15, after the adhesive 15a is first applied to the base plate 16, the member 20 is placed on the applied adhesive 15a and further, the adhesive 15a is applied to the member 20 so as to fill the opening parts 20a with the adhesive 15a. Then, the base substance 12 is placed on the adhesive 15a applied to the member 20 and the adhesive 15a is cured by heating or ultraviolet irradiation, etc. Consequently, the adhesive layer 15 including the member 20 is formed.

Thus, the member 20 is formed integrally with the adhesive layer 15, so that the member 20 can fill a gap between the base substance 12 and the base plate 16 and peel etc. of the exposed member 20 can be prevented.

The example in which the adhesive layer 15 includes the member 20 including a substance having plasma resistance as a main component has been shown above, but the adhesive layer 15 may contain a substance having plasma resistance instead of the member 20. As the substance having plasma resistance, for example, particles of a fluorine resin can be used. The particles of the fluorine resin are preferably particles of polytetrafluoroethylene. This is because polytetrafluoroethylene has good plasma resistance.

In order to form the adhesive layer 15 containing a substance having plasma resistance, particles etc. of a fluorine resin are previously mixed into the adhesive 15a. Then, after the adhesive 15a is applied to the base plate 16, the base substance 12 is placed on the applied adhesive 15a and the adhesive 15a is cured by heating or ultraviolet irradiation, etc. Consequently, the adhesive layer 15 containing the substance having plasma resistance such as the particles of the fluorine resin is formed.

By containing a substance having plasma resistance or including the member 20, which includes a substance having plasma resistance as a main component, in the adhesive layer 15 thus, plasma resistance of the adhesive layer 15 can be improved. Consequently, an outer edge of the adhesive layer 15 can be prevented from being eroded by being exposed to plasma even when the substrate temperature regulation fixed apparatus 10 is used in the plasma. Also, a situation in which plasma intrudes from a through hole of the gas passage 18 etc. disposed in the adhesive layer 15 and a peripheral part of the through hole of the adhesive layer 15 is eroded by being exposed to the plasma in the case of plasma cleaning can be prevented. Also, properties of adhesion between the base substance 12 and the base plate 16 can be maintained by disposing, for example, net-shaped opening parts in the member 20.

The base plate 16 is means for supporting the electrostatic chuck 11. A heating element (not shown) or a water passage 14 is disposed in the base plate 16, and temperature control of the base substance 12 is performed. As a material of the base plate 16, for example, Al can be used. The heating element (not shown) generates heat by applying a voltage, and heats the base substance 12 through the adhesive layer 15.

The water passage 14 has a cooling water inlet part 14a and a cooling water outlet part 14b formed in a lower surface 16b of the base plate 16. The cooling water inlet part 14a and the cooling water outlet part 14b are connected to a cooling water controller (not shown) disposed outside the substrate temperature regulation fixed apparatus 10. The cooling water controller (not shown) introduces cooling water from the cooling water inlet part 14a to the water passage 14 and discharges the cooling water from the cooling water outlet part 14b. The base substance 12 is cooled through the adhesive layer 15 by circulating the cooling water and cooling the base plate 16.

A gas passage 18 extending through the base substance 12, the adhesive layer 15 and the base plate 16 is formed in the base substance 12, the adhesive layer 15 and the base plate 16. The gas passage 108 has plural gas inlet parts 18a formed in the lower surface 16b of the base plate 16 and plural gas outlet parts 18b formed in the upper surface 12a of the base substance 12. The plural gas inlet parts 18a are connected to a gas pressure controller (not shown) disposed outside the substrate temperature regulation fixed apparatus 10. The gas pressure controller (not shown) can vary a pressure of an inert gas in the range of, for example, 0 to 50 Torr and introduce the inert gas from the gas inlet parts 18a to the gas passage 18.

Figure 8:
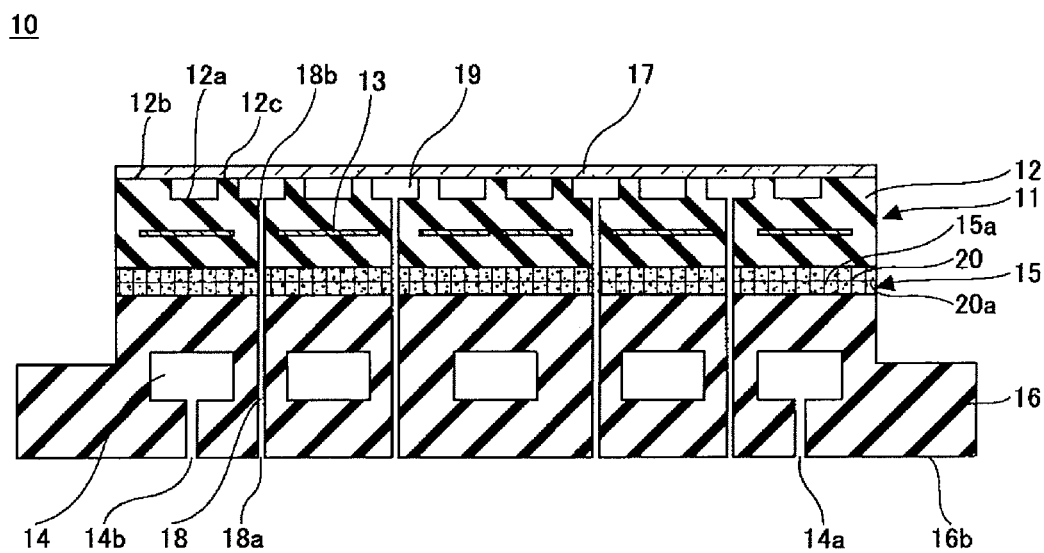
FIG. 8 is a sectional view simplifying and illustrating a state in which the substrate temperature regulation fixed apparatus according to the invention vacuums and holds a substrate.

FIG. 8 is a sectional view simplifying and illustrating a state in which the substrate temperature regulation fixed apparatus according to the invention vacuums and holds a substrate. In FIG. 8, the same numerals are assigned to the same components as those of FIGS. 4 and 5 and its description may be omitted. In FIG. 8, numeral 17 is a substrate and numeral 19 is a gas filling part filled with an inert gas. Referring to FIG. 8, the substrate 17 is vacuumed and held on upper surfaces of the multiple projection parts 12c and the outer peripheral seal ring 12b.

Temperature control of the substrate 17 is performed by the water passage 14 or the heating element (not shown) disposed in the base plate 16. The substrate 17 is, for example, a silicon wafer. A thickness of the substrate 17 is, for example, 700 μm to 1000 μm. The invention can also be applied to substrates with thicknesses other than this thickness by selecting a dimension and a shape of the projection part 12c.

The gas pressure controller (not shown) introduces an inert gas from the plural gas inlet parts 18a to the gas passage 18. When the introduced inert gas is discharged from the gas outlet parts 18b and the gas filling part 19 which is space formed between a lower surface of the substrate 17 and the upper surface 12a of the base substance 12 is filled with the inert gas, thermal conductivity between the base substance 12 and the substrate 17 improves. As the inert gas, for example, He or Ar can be used.

According to the substrate temperature regulation fixed apparatus 10 according to the first embodiment of the invention, plasma resistance of the adhesive layer 15 can be improved by containing a substance having plasma resistance or including the member 20, which includes a substance having plasma resistance as a main component, in the adhesive layer 15. Consequently, an outer edge of the adhesive layer 15 can be prevented from being eroded by being exposed to plasma even when the substrate temperature regulation fixed apparatus 10 is used in the plasma. Also, a situation in which plasma intrudes from a through hole of the gas passage 18 etc. disposed in the adhesive layer 15 and a peripheral part of the through hole of the adhesive layer 15 is eroded by being exposed to the plasma in the case of plasma cleaning can be prevented.

As a result of that, reduction in thermal conductivity between the base substance 12 and the substrate 17 by leakage of an inert gas from the portion eroded by plasma of the adhesive layer 15 or contamination of the substrate 17 with particles by occurrence of the particles can be prevented.

In addition, a member included in the adhesive layer 15 may have a form different from that of the member 20 illustrated in the first embodiment. Other examples of the member included in the adhesive layer 15 are shown in the following modified examples 1 to 3 of the first embodiment.

Modified Example 1 of First Embodiment

Figure 9:
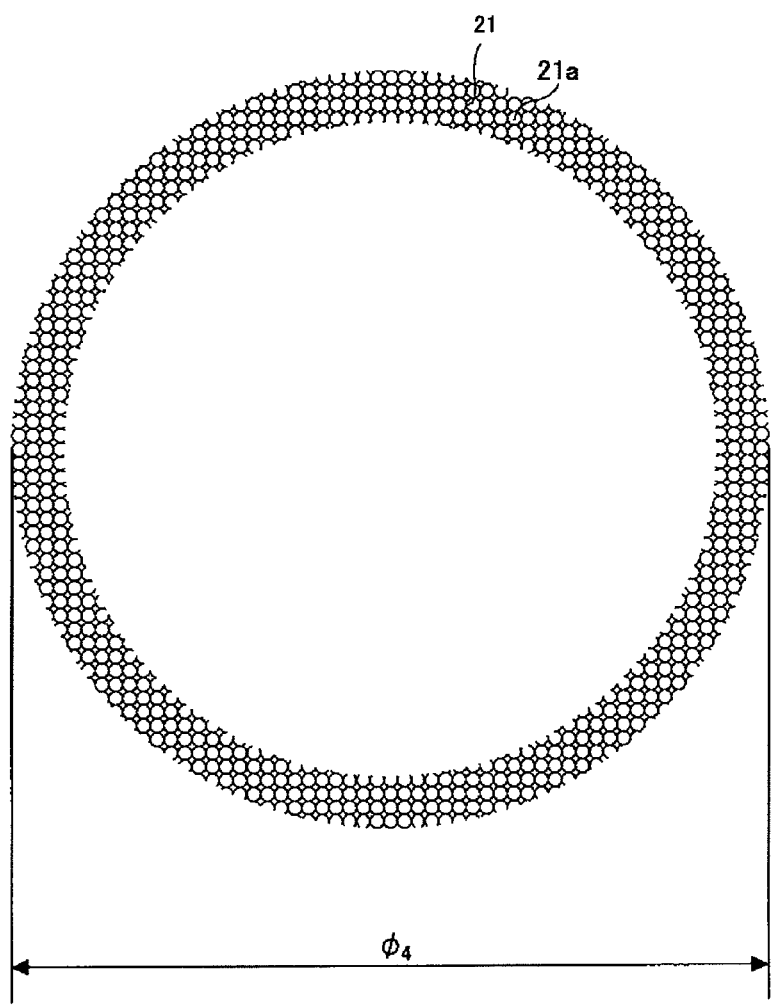
FIG. 9 is a plan view showing another example of a member included in an adhesive layer (first).

FIG. 9 is a plan view showing another example of a member included in an adhesive layer. A member 21 shown in FIG. 9 is substantially an annular member in plan view and is disposed in only an outer edge of the adhesive layer 15. An outside diameter $\phi_4$ of the member 21 is somewhat smaller than or substantially equal to the outside diameter $\phi_1$ of the base substance 12. A thickness of the member 21 can properly be determined according to the thickness of the adhesive layer 15. The member 21 includes a substance having plasma resistance as a main component. Since a concrete material constructing the member 21 is equal to that of the member 20, its description is omitted.

The member 21 has plural opening parts 21a which are through holes. The plural opening parts 21a are filled with the adhesive 15a. Arrangement of the plural opening parts 21a in the member 21 may be regular or irregular. A size or a shape of the opening parts 21a is not particularly limited and can be set at, for example, about 1 to 10 mm in diameter in substantially a circular through hole in plan view. It is unnecessary that the sizes of the plural opening parts 21a should be the same.

Since plasma erodes the adhesive layer 15 from the outside, the member 21 as shown in FIG. 9 is disposed in only the outer edge of the adhesive layer 15 and thereby, the adhesive layer 15 can be prevented from being eroded from the outer edge by the plasma.

The reason why the member 21 has the plural opening parts 21a is because properties of adhesion between the base substance 12 and the base plate 16 are improved. For example, a member, which does not have opening parts and includes a substance having plasma resistance as a main component, can also be included in the adhesive layer 15. Also in this case, an effect of the invention described below is achieved, but the properties of adhesion between the base substance 12 and the base plate 16 reduce, so that it is preferable to have the opening parts.

According to the modified example 1 of the first embodiment of the invention, plasma resistance of the adhesive layer 15 can be improved by including the member 21, which includes a substance having plasma resistance as a main component, in the adhesive layer 15. Consequently, an outer edge of the adhesive layer 15 can be prevented from being eroded by being exposed to plasma even when the substrate temperature regulation fixed apparatus 10 is used in the plasma.

As a result of that, reduction in thermal conductivity between the base substance 12 and the substrate 17 by leakage of an inert gas from the portion eroded by plasma of the adhesive layer 15 or contamination of the substrate 17 with particles by occurrence of the particles can be prevented.

Modified Example 2 of First Embodiment

Figure 10:
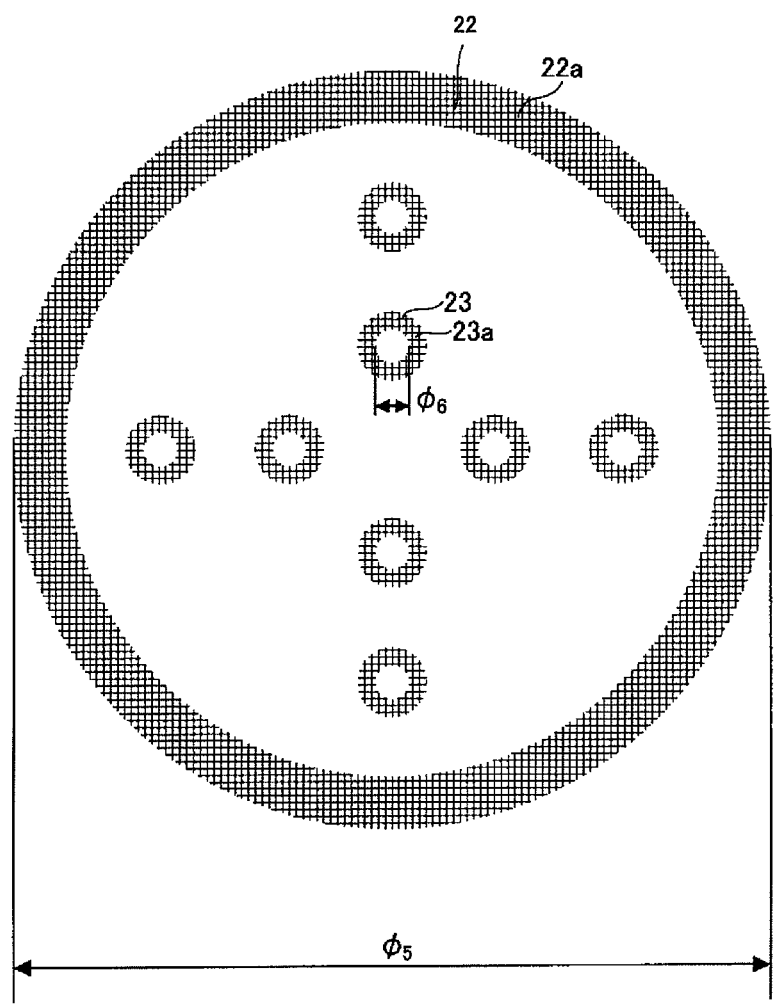
FIG. 10 is a plan view showing a further example of a member included in an adhesive layer (second).

FIG. 10 is a plan view showing a further example of a member included in an adhesive layer. Members 22 and 23 shown in FIG. 10 are substantially annular members in plan view, and the member 22 is included in an outer edge of the adhesive layer 15, and the member 23 is included in a peripheral part of a through hole of the adhesive layer 15. The through hole herein includes the gas passage 18 shown in FIG. 5 and other through holes. The other through holes refer to, for example, a lift pin hole for inserting a lift pin or a sensor hole for measuring a temperature of a substrate.

An outside diameter $\phi_5$ of the member 22 is somewhat smaller than or substantially equal to the outside diameter $\phi_1$ of the base substance 12. An inside diameter $\phi_6$ of the member 23 is somewhat larger than or substantially equal to a hole diameter of a through hole of the adhesive layer 15. Thicknesses of the members 22 and 23 can properly be determined according to the thickness of the adhesive layer 15. The members 22 and 23 include a substance having plasma resistance as a main component. Since a concrete material constructing the members 22 and 23 is equal to that of the member 20, its description is omitted.

In the members 22 and 23, plural opening parts 22*a* and 23*a* are disposed in a net shape (mesh shape). The plural opening parts 22*a* and 23*a* are filled with the adhesive 15*a*. Arrangement of the plural opening parts 22*a* and 23*a* in the members 22 and 23 may be regular or irregular. A size of the plural opening parts 22*a* and 23*a* is not particularly limited and can be set at, for example, about 10 to 200 mesh of mesh standards. It is unnecessary that the sizes of all the opening parts 22*a* and 23*a* should be the same.

Since plasma erodes the adhesive layer 15 from the outside, the member 22 as shown in FIG. 10 is disposed in an outer edge of the adhesive layer 15 and thereby, the adhesive layer 15 can be prevented from being eroded from the outer edge by the plasma. Also, in the case of plasma cleaning, plasma also erodes the adhesive layer 15 from a peripheral part of a through hole, so that the member 23 as shown in FIG. 10 is disposed in the peripheral part of the through hole of the adhesive layer 15 and thereby, the adhesive layer 15 can be prevented from being eroded from the peripheral part of the through hole by the plasma.

The reason why the members 22 and 23 have the plural opening parts 22*a* and 23*a* is because properties of adhesion between the base substance 12 and the base plate 16 are improved. For example, a member, which does not have opening parts and includes a substance having plasma resistance as a main component, can also be included in the adhesive layer 15. Also in this case, an effect of the invention described below is achieved, but the properties of adhesion between the base substance 12 and the base plate 16 reduce, so that it is preferable to have the opening parts.

According to the modified example 2 of the first embodiment of the invention, plasma resistance of the adhesive layer 15 can be improved by including the members 22 and 23, which include a substance having plasma resistance as a main component, in the adhesive layer 15. Consequently, an outer edge of the adhesive layer 15 can be prevented from being eroded by being exposed to plasma even when the substrate temperature regulation fixed apparatus 10 is used in the plasma. Also, a situation in which plasma intrudes from a through hole of the gas passage 18 etc. disposed in the adhesive layer 15 and a peripheral part of the through hole of the adhesive layer 15 is eroded by being exposed to the plasma in the case of plasma cleaning can be prevented.

As a result of that, reduction in thermal conductivity between the base substance 12 and the substrate 17 by leakage of an inert gas from the portion eroded by plasma of the adhesive layer 15 or contamination of the substrate 17 with particles by occurrence of the particles can be prevented.

Modified Example 3 of First Embodiment

Figure 11:
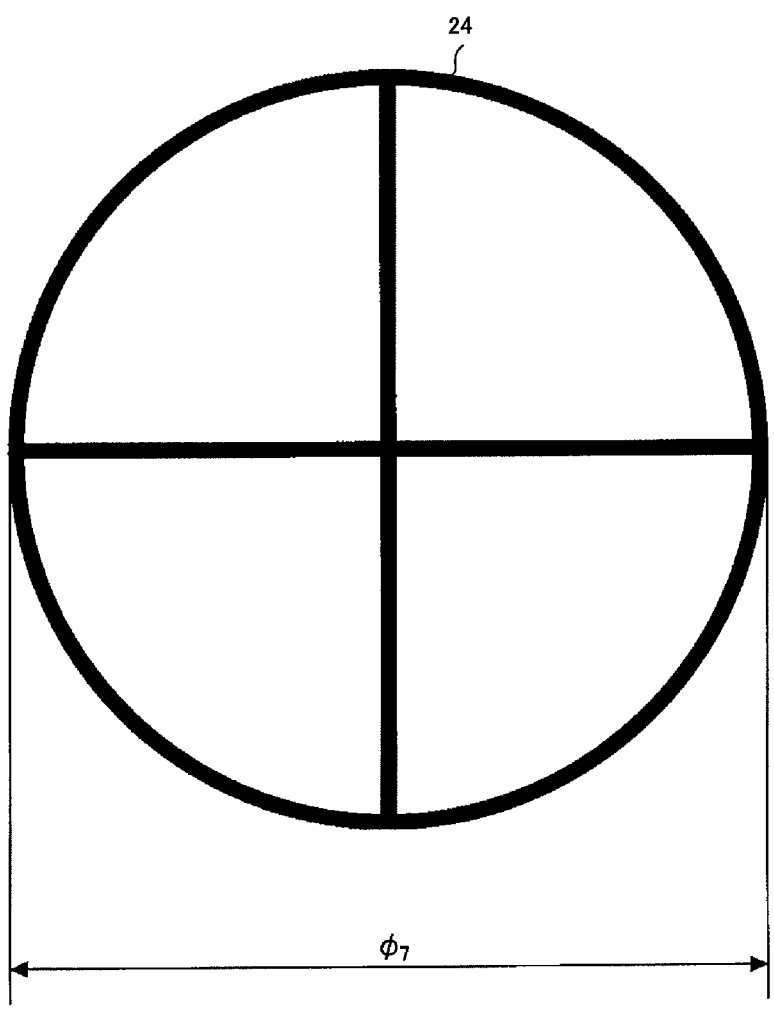
FIG. 11 is a plan view showing a further example of a member included in an adhesive layer (third).
Figure 12:
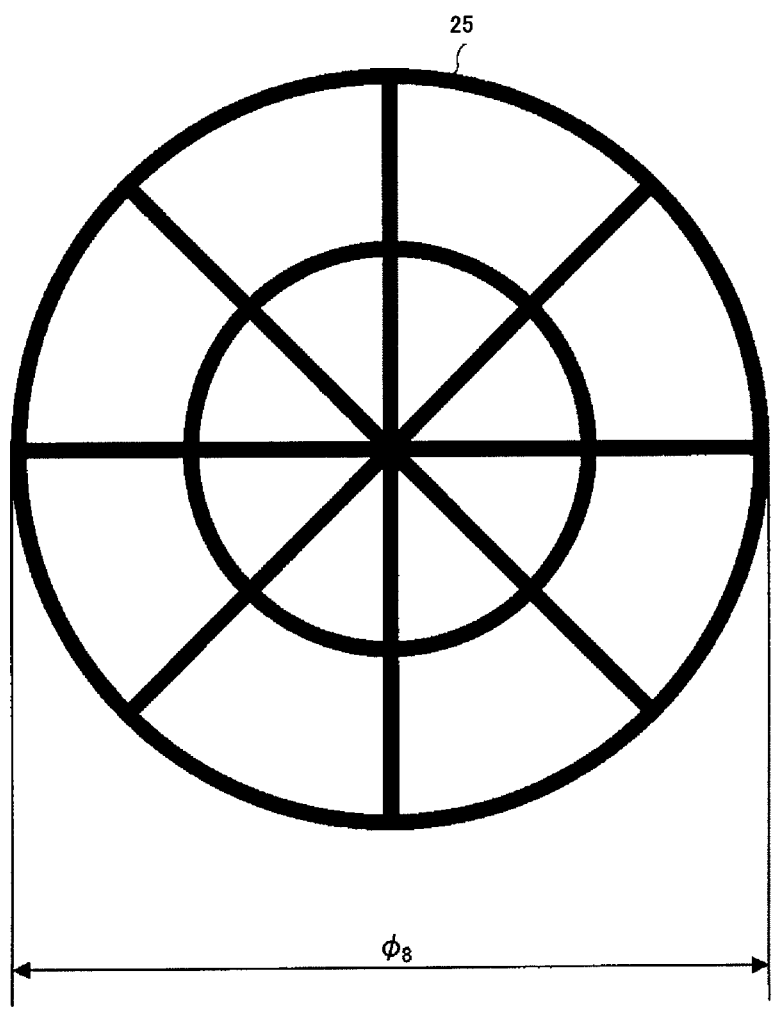
FIG. 12 is a plan view showing a further example of a member included in an adhesive layer (fourth).
Figure 13:
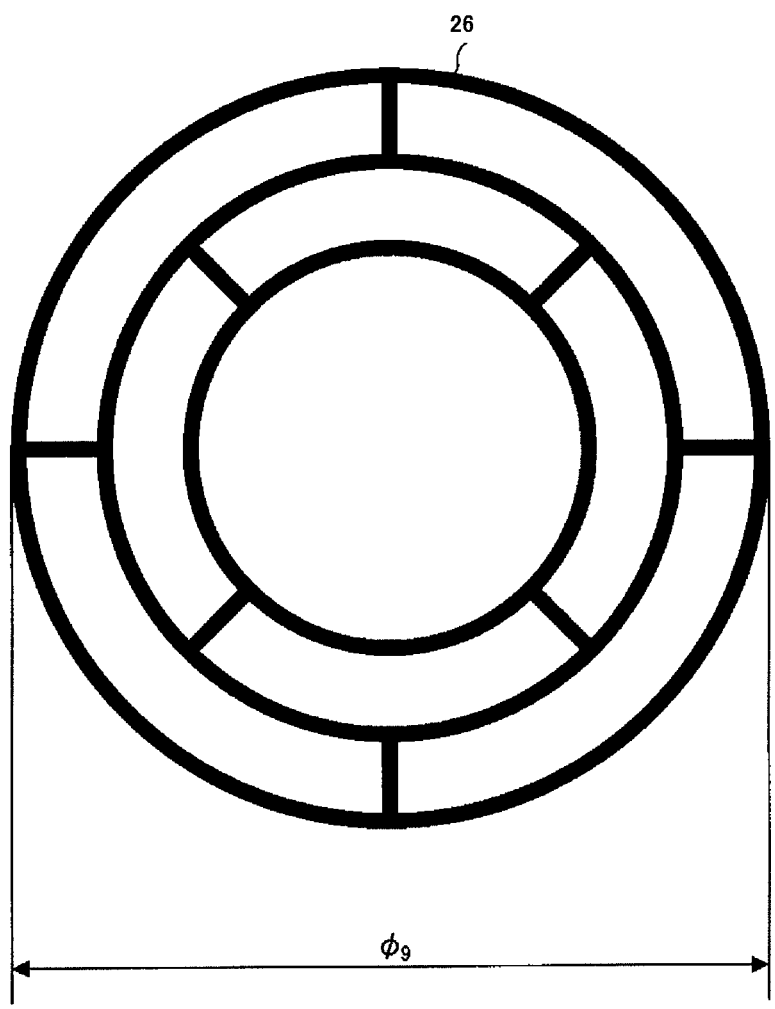
FIG. 13 is a plan view showing a further example of a member included in an adhesive layer (fifth).

FIGS. 11 to 13 are plan views showing further examples of a member included in an adhesive layer. Members 24 to 26 shown in FIGS. 11 to 13 are substances in which a predetermined opening part is disposed in a sheet including a substance having plasma resistance as a main component. Since a concrete material constructing the members 24 to 26 is equal to that of the member 20, its description is omitted.

The member 24 shown in FIG. 11 has a structure in which substantially an annular part in plan view is coupled by plural substantially linear parts in plan view. The portions excluding substantially the annular part in plan view and plural substantially the linear parts in plan view are opening parts, and the opening parts are filled with the adhesive 15*a*. Widths of substantially the annular part in plan view and plural substantially the linear parts in plan view can be set at, for example, about 2 to 10 mm. An outside diameter $\phi_7$ of the member 24 is somewhat smaller than or substantially equal to the outside diameter $\phi_1$ of the base substance 12.

The member 25 shown in FIG. 12 has a structure in which substantially annular parts with substantially a concentric shape of two small and large kinds in plan view are coupled by plural substantially linear parts in plan view. The portions excluding substantially the annular parts in plan view and plural substantially the linear parts in plan view are opening parts, and the opening parts are filled with the adhesive 15*a*. Widths of substantially the annular parts in plan view and plural substantially the linear parts in plan view can be set at, for example, about 2 to 10 mm. An outside diameter $\phi_8$ of the member 25 is somewhat smaller than or substantially equal to the outside diameter $\phi_1$ of the base substance 12.

The member 26 shown in FIG. 13 has a structure in which substantially annular parts with substantially a concentric shape of three small, medium and large kinds in plan view are coupled by plural substantially linear parts in plan view. The portions excluding substantially the annular parts in plan view and plural substantially the linear parts in plan view are opening parts, and the opening parts are filled with the adhesive 15a. Widths of substantially the annular parts in plan view and plural substantially the linear parts in plan view can be set at, for example, about 2 to 10 mm. An outside diameter $\phi_9$ of the member 26 is somewhat smaller than or substantially equal to the outside diameter $\phi_1$ of the base substance 12.

Thicknesses of the members 24 to 26 can properly be determined according to the thickness of the adhesive layer 15. An opening part is not disposed in substantially the annular parts in plan view and plural substantially the linear parts in plan view of the members 24 to 26. This is because properties of adhesion between the base substance 12 and the base plate 16 can sufficiently be ensured even when the opening part is not disposed in substantially the annular parts in plan view and plural substantially the linear parts in plan view since the portions excluding substantially the annular parts in plan view and plural substantially the linear parts in plan view are the opening parts and the opening parts are filled with the adhesive 15a.

Since plasma erodes the adhesive layer 15 from the outside, the members 24 to 26 are disposed in such a form as to surround at least an outer edge of the adhesive layer 15 as shown in FIGS. 11 to 13 and thereby, the adhesive layer 15 can be prevented from being eroded from the outer edge etc. by the plasma.

According to the modified example 3 of the first embodiment of the invention, plasma resistance of the adhesive layer 15 can be improved by including the member 24, 25 or 26, which includes a substance having plasma resistance as a main component, in the adhesive layer 15. Consequently, an outer edge of the adhesive layer 15 can be prevented from being eroded by being exposed to plasma even when the substrate temperature regulation fixed apparatus 10 is used in the plasma.

As a result of that, reduction in thermal conductivity between the base substance 12 and the substrate 17 by leakage of an inert gas from the portion eroded by plasma of the adhesive layer 15 or contamination of the substrate 17 with particles by occurrence of the particles can be prevented.

The preferred embodiment and the modified examples of the invention have been described above in detail, but the invention is not limited to the embodiment and the modified examples described above, and various modifications and replacements can be made in the embodiment and the modified examples described above without departing from the scope of the invention.

For example, in each of the embodiment and the modified examples, the example of applying the invention to the coulombic type electrostatic chuck has been shown, but the invention can similarly be applied to a Johnson-Rahbeck type electrostatic chuck.

Also, in each of the embodiment and the modified examples, the example of applying the invention to the electrostatic chuck having a surface shape of an embossed type (type in which multiple projection parts are formed in an upper surface of a base substance) has been shown, but the invention can similarly be applied to an electrostatic chuck without having the surface shape of the embossed type.

Also, the opening parts 21a of the member 21 illustrated in FIG. 9 of the modified example 1 of the first embodiment may be a net-shaped opening part, and the opening parts 22a and 23a of the members 22 and 23 illustrated in FIG. 10 of the modified example 2 of the first embodiment may be a through hole.

Also, in FIGS. 11 to 13 of the modified example 3 of the first embodiment, shapes of the opening parts which are the portions excluding substantially the annular parts in plan view and plural substantially the linear parts in plan view may be shapes other than the shapes illustrated in FIGS. 11 to 13.

Also, for example, a net-shaped opening part may be disposed in substantially the annular parts in plan view and plural substantially the linear parts in plan view illustrated in FIGS. 11 to 13 of the modified example 3 of the first embodiment.

What is claimed is:

1. A substrate temperature regulation fixed apparatus comprising:
    an electrostatic chuck on which a vacuumed object is placed;
    an adhesive layer comprising a silicon adhesive and a member having a plurality of openings in a net-shape provided along a peripheral edge of the adhesive layer in plan view, the silicon adhesive being filled in the plurality of openings; and
    a base plate having a cooling passage contained therein,
    wherein the electrostatic chuck is fixed on the base plate through the adhesive layer to form a stacked structure with the base plate being under the electrostatic chuck,
    wherein at a radially inner portion of the adhesive layer that does not include the member having a plurality of openings in a net-shape, only the silicon adhesive is formed between the electrostatic chuck and the base plate,
    wherein the member having a plurality of openings is formed of a fluorine resin as a main component, and
    wherein the member is included in a peripheral part of a through hole of the adhesive layer in plan view.

2. A substrate temperature regulation fixed apparatus as claimed in claim 1, wherein the fluorine resin is polytetrafluoroethylene.

3. A substrate temperature regulation fixed apparatus as claimed in claim 1, further comprising:
    a gas passage extending through the electrostatic chuck and the adhesive layer, the gas passage introducing an inert gas, whose pressure is regulated, in a space formed by an upper surface of the electrostatic chuck and a lower surface of the vacuumed object,
    wherein the member is included so as to surround a portion through which the gas passage of the adhesive layer extends in plan view.

* * * * *